United States Patent
Park (10) Patent No.: US 7,429,741 B2
(45) Date of Patent: Sep. 30, 2008

(54) FARADAY SYSTEM AND ION IMPLANTATION APPARATUS COMPRISING THE FARADAY SYSTEM

(75) Inventor: Byung-Hyun Park, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 238 days.

(21) Appl. No.: 11/376,292

(22) Filed: Mar. 16, 2006

(65) Prior Publication Data
US 2007/0075260 A1 Apr. 5, 2007

(30) Foreign Application Priority Data
Sep. 22, 2005 (KR) .................. 10-2005-0088151

(51) Int. Cl.
*H01J 37/04* (2006.01)
(52) U.S. Cl. .................. 250/397; 250/492.21
(58) Field of Classification Search .................. 250/397, 250/492.21
See application file for complete search history.

(56) References Cited

U.S. PATENT DOCUMENTS

| | | | |
|---|---|---|---|
| 4,751,393 A * | 6/1988 | Corey et al. ............... | 250/492.2 |
| 6,723,998 B2 | 4/2004 | Bisson et al. | |
| 7,109,499 B2 * | 9/2006 | Angel et al. ........... | 250/492.21 |
| 2004/0058518 A1 | 3/2004 | Fang et al. | |

* cited by examiner

Primary Examiner—Kiet T Nguyen
(74) Attorney, Agent, or Firm—Volentine & Whitt, PLLC (57) ABSTRACT

A Faraday system is disclosed wherein the Faraday system comprises a Faraday cup adapted to collect an ion beam to generate a current, a suppression electrode adapted to form an electric field adjacent to an inlet of the Faraday cup to prevent secondary electrons from discharging from the Faraday cup in response to the ion beam, and a housing surrounding the Faraday cup and the suppression electrode and comprising a plurality of apertures, wherein each aperture is adapted to selectively receive an ion beam comprising a corresponding type of conductive impurities.

20 Claims, 4 Drawing Sheets

FARADAY SYSTEM AND ION IMPLANTATION APPARATUS COMPRISING THE FARADAY SYSTEM

BACKGROUND OF THE INVENTION

1. Technical Field

Embodiments of the invention relate to a semiconductor manufacturing apparatus. More particularly, embodiments of the invention relate to a Faraday system adapted to determine the concentration of an ion beam irradiated onto a wafer, and an ion implantation apparatus using the Faraday system.

This application claims priority to Korean Patent Application No. 10-2005-0088151, filed Sep. 22, 2005, the subject matter of which is hereby incorporated by reference in its entirety.

2. Discussion of Related Art

Contemporary semiconductor devices are characterized by increasing integration density, reduced overall size, and improved performance. These results are achieved through careful improvements in the complex sequence of fabrication processes used to make semiconductor devices. One of these fabrication processes generally involves the implantation of conductive impurity ions into a silicon wafer.

Ion implantation is a basic fabrication process through which impurities are selectively introduced into a semiconductor substrate. Many times, an ion implantation process is performed in conjunction with a thermal diffusion process. Despite its long history of use in the fabrication of semiconductor devices, the small size and increasingly strict manufacturing tolerances associated with contemporary semiconductor devices have generated a greater emphasis on the precise control of ion implantation processes. Further, from a mass production perspective, relatively precise control over implanted impurity concentrations is required to improve reproducibility of semiconductor devices.

There are a variety of ion implantation apparatuses in which a precise ion implantation process may be performed. A conventional ion implantation apparatus comprises an ion source adapted to produce conductive impurity ions, a mass analyzer adapted to the separation and extraction of the impurity ions, a magnetic collector adapted to collect separated/extracted impurity ions, and a scanning system adapted to output an ion beam of defined beam width comprising the collected impurity ions. The conventional ion implantation apparatus further comprises an accelerator adapted to accelerate the ion beam output by the scanning system, a target adapted to hold (i.e., fix) a wafer and move the wafer in at least one dimension, and a Faraday system disposed adjacent to the target and adapted to determine the concentration (i.e., dose) of the ion beam.

The Faraday system may precisely determine the concentration at which the ion beam implants impurity ions into the wafer so that the ion implantation apparatus can prevent impurity ions from being implanted with a concentration that is too high or too low. Accordingly, the Faraday system is disposed adjacent to, but separated from the target holding the wafer, so that the Faraday system may collect an edge portion of the ion beam being irradiated on the wafer to thereby count the concentration of impurity ions in the ion beam.

Exemplary, conventional Faraday systems are disclosed in U.S. Pat. Nos. 4,922,106, 4,980,562, and 6,723,988, the subject matter of which is hereby incorporated by reference.

Hereinafter, a conventional Faraday system will be described with reference to Figure (FIG.) 1 which is a cross-sectional schematic view.

Figure 1:
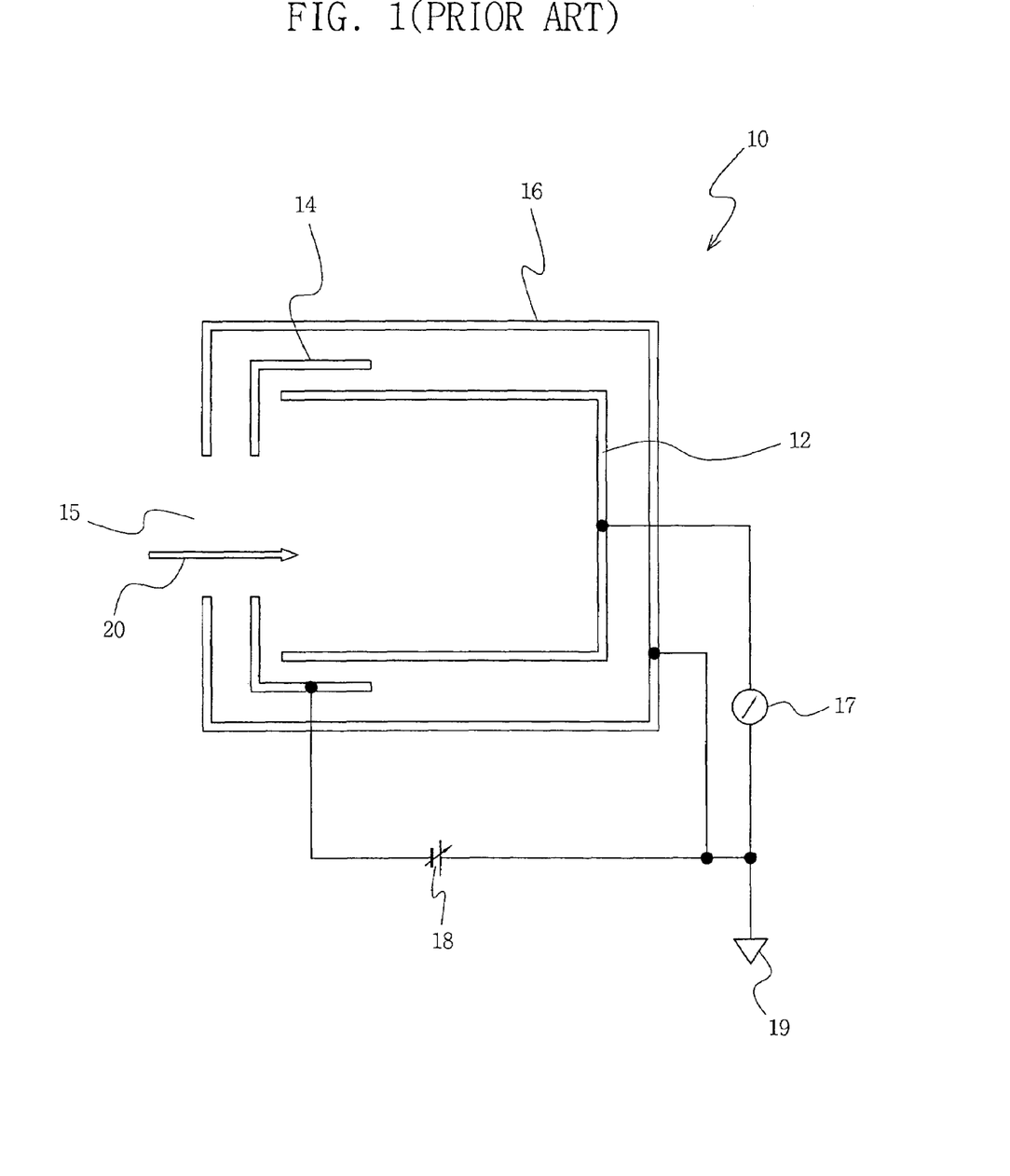
FIG. 1 is a cross-sectional view schematically illustrating the structure of a conventional Faraday system.

As shown in FIG. 1, a conventional Faraday system 10 comprises a Faraday cup 12 adapted to collect an ion beam 20 and generate a corresponding current. Faraday system 10 further comprises a suppression electrode 14 adapted to form an electric field of defined magnitude adjacent to an inlet of Faraday cup 12 in order to prevent secondary electrons collected in Faraday cup 12 from being discharging in response to ion beam 20. Faraday system 10 still further comprises a housing 16 surrounding suppression electrode 14 and Faraday cup 12 and having an aperture 15 through which ion beam 20 may pass and enter Faraday cup 12.

Faraday cup 12 is a bowl-shaped metal structure. Assuming ion beam 20 comprises a plurality of conductive impurity ions having a positive charge, for example, a flow of electrons (i.e., electric current) will be induced in Faraday cup 12 in response to the impact of ion beam 20. This current may be detected by an ammeter 17 connected in series between Faraday cup 12 and ground 19.

Suppression electrode 14 surrounding the opening of Faraday cup 12 may be connected to an external voltage supply element 18 in order to form the requisite electric field. The electric field prevents ion beam 20 from colliding with the outer surface of Faraday cup 12, and thereby impedes the generation of, accumulation on, and discharge of secondary electrons in relation to Faraday cup 12.

In addition, housing 16 shields the outer surface of Faraday cup 12 from ion beam 20 while allowing ion beam 20 to pass into Faraday cup 12 through aperture 15 formed in housing 16. Housing 16 is connected to ground 19 such that an electric charge potential is developed on housing 16 by ion beam 20. The size of aperture 15 defines the portion of ion beam 20 provided into Faraday cup 12.

As illustrated in FIG. 1, a first face of housing 16 is oriented to be perpendicular to the direction of ion beam 20. Aperture 15 is commonly a rectangular shape and is disposed in the center of the first face of housing 16.

However, within this system configuration, impurity ions of first conductivity type may nonetheless collect on the first face of housing 16 in areas proximate aperture 15. Thereafter, when an impurity ions of second conductivity type are subsequently applied through aperture 15 of housing 16, the impurity ions of the first conductivity type collected on the first face of housing 16 may be picked-up by the ion beam 20 communicating the subsequently applied second conductivity type impurity ions, and thereby contaminate the surface of the wafer being processed in Faraday system 10. Such contamination reduces production yield of the semiconductor devices formed on the wafer.

SUMMARY OF THE INVENTION

Therefore, embodiments of the invention provide an ion implantation apparatus adapted to prevent impurity ions unintentionally collected on some portion of the housing of a Faraday system from contaminating a target wafer.

In one embodiment, the invention provides a Faraday system comprising a Faraday cup adapted to collect an ion beam to generate a current, a suppression electrode adapted to form an electric field adjacent to an inlet of the Faraday cup to prevent secondary electrons from discharging from the Faraday cup in response to the ion beam, and a housing surrounding the Faraday cup and the suppression electrode and comprising a plurality of apertures, wherein each aperture is adapted to selectively receive an ion beam comprising a corresponding type of conductive impurities.

In another embodiment, the invention provides an ion implantation apparatus comprising an ion source adapted to produce conductive impurity ions, a mass analyzer adapted to separation-extract conductive impurity ions having a selected mass, and a magnetic focusing electrode adapted to focus the conductive impurity ions separation-extracted by the mass analyzer. The ion implantation apparatus further comprises a scanning system adapted to control a beam width and a concentration of an ion beam comprising the conductive impurity ions focused by the magnetic focusing electrode, and adapted to provide the ion beam to a wafer surface; an accelerator adapted to accelerate the ion beam scanned by the scanning system; a target adapted to hold and move a wafer while the wafer is exposed to the ion beam accelerated by the accelerator; and, a Faraday system comprising a housing disposed adjacent to the target, surrounding a Faraday cup adapted to determine the concentration of the ion beam, comprising a plurality of apertures, and adapted to rotate in accordance with the type of conductive impurity ions the ion beam provided by the scanning system comprises, wherein each aperture is adapted to selectively receive an ion beam comprising a corresponding type of conductive impurity ions.

BRIEF DESCRIPTION OF THE DRAWINGS

Exemplary embodiments of the invention will be described hereinafter with reference to the accompanying drawings, in which like reference symbols refer to like or similar elements. In the drawings.

DESCRIPTION OF THE EXEMPLARY EMBODIMENTS

The exemplary apparatuses illustrated in FIGS. 2 through 4 will be described in relation to a conventionally understood system of mutually orthogonal directions; a X-direction (first direction), a Y-direction (second direction), and a Z-direction (third direction). As used herein, each direction comprises both a positive direction and a negative direction (e.g., the "X-direction" may comprises both a positive x-direction and a negative x-direction). The use of these arbitrarily selected and relative directions is entirely one of convenience and is intended only to clarify the following written description. Those of ordinary skill in the art will understand that the reference directions are used to explain certain exemplary relative spatial relationships and are not intended to limit the scope of the invention.

Figure 2:
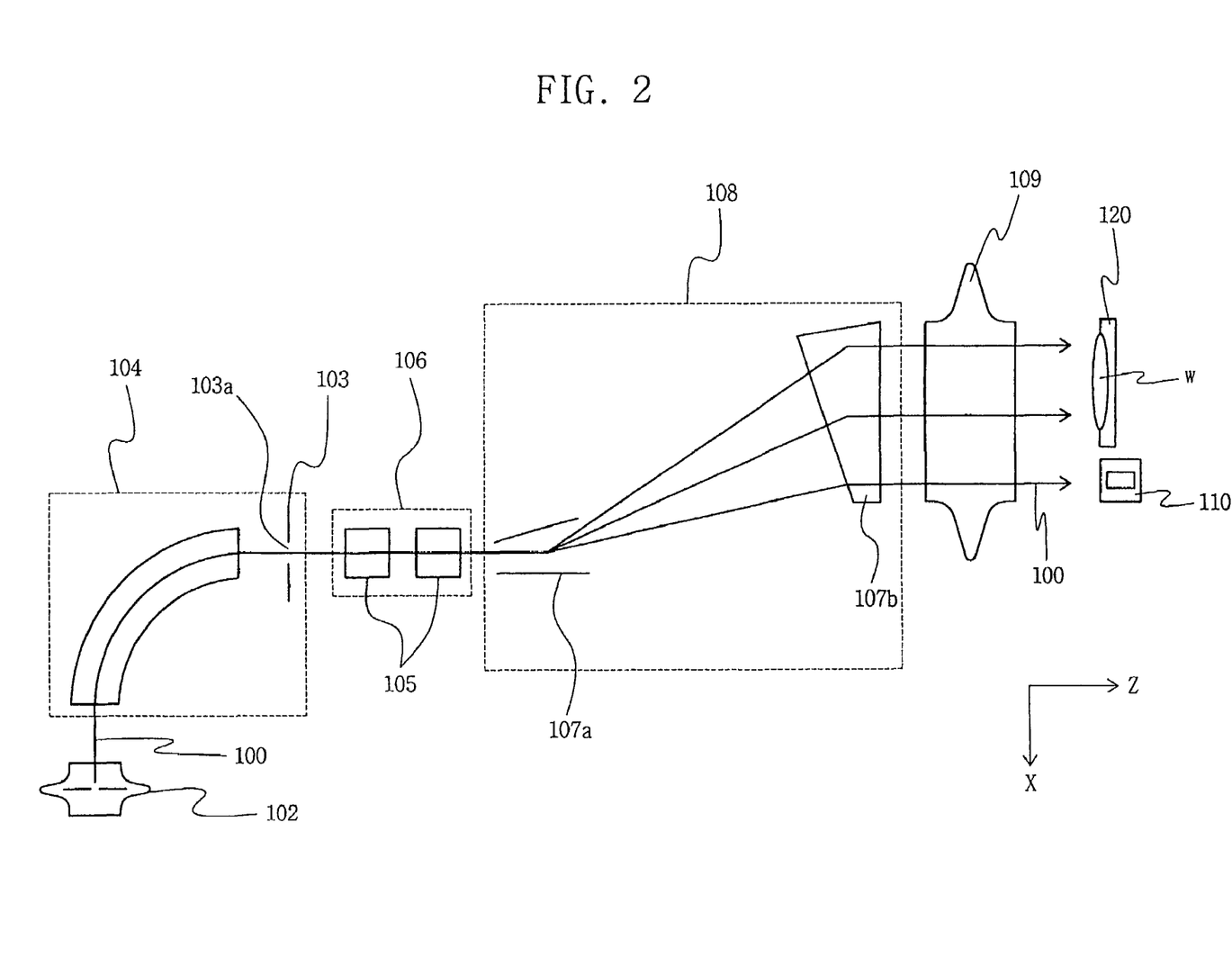
FIG. 2 is a plan view schematically showing the structure of an ion implantation apparatus comprising a Faraday system in accordance with an exemplary embodiment of the invention.

FIG. 2 is a plan view schematically showing the structure of an ion implantation apparatus comprising a Faraday system in accordance with an exemplary embodiment of the invention.

As shown in FIG. 2, an ion implantation apparatus according to an exemplary embodiment of the invention comprises an ion source 102 adapted to produce conductive impurity ions, a mass analyzer 104 adapted to separate/extract selected conductive impurity ions, and a first magnetic focusing electrode 106 adapted to focus the conductive impurity ions obtained from mass analyzer 104. The ion implantation apparatus of FIG. 2 further comprises a scanning system 108 adapted to control the beam width (i.e., line width) and the ion concentration of ion beam 100. Ion beam 100 thus comprises the conductive impurity ions focused in first magnetic focusing electrode 106, and is thereby provided to the surface of a wafer "W".

An accelerator 109 is adapted to accelerate ion beam 100 output by scanning system 108 towards a target 120 adapted to hold and move wafer W proximate a Faraday system 110. Referring to FIGS. 2 and 4, Faraday system 110 comprises a housing 116 disposed adjacent to target 120 and surrounding a Faraday cup 112. Faraday system 110 is adapted to measure (e.g., count ions) the concentration of ion beam 100, and is further adapted to rotate such that a selected face of housing 116 positioned perpendicular to ion beam 100 will correspond to a selected type of conductive impurity ions contained within ion beam 100.

Referring again to FIG. 2, ion source 102 excites various kinds of conductive impurities such as boron, BF2, phosphorous, arsenic and the like into an ion state having a positive charge and supplies such to mass analyzer 104.

Ion source 102 comprises, for example, a source gas supply element adapted to supply conductive impurities in the form of a source gas, a filament adapted to release thermal electrons to charge the source gas of conductive impurities, a source suppression electrode adapted to trap secondary electrons released from the conductive impurity ions charged by the thermal electrons, and a source acceleration electrode adapted to accelerate the conductive impurity ions towards mass analyzer 104.

The source gas collides with the thermal electrons to generate a plurality of ion species, which have various charges and from which atom ions or molecular ions having diverse masses are generated. For example, when phosphorous (P) is used as the source gas, ion source 102 may generate a P+ ion (single charged ion) and a P++ ion (double charged ion). In addition, ion source 102 may generate an atom ion such as P+, a P2+ ion having a different mass than the atom ion, and/or a molecular ion such as P4+. Additionally, ion source 102 may generate an atom ion such as P++ or a molecular ion such as P2++. After ions of first conductivity type are generated by ion source 102 from a source gas, ion source 102 is typically cleaned using a purge gas, such as nitrogen or argon, before ions of second conductivity type are generated by ion source 102. For example, ion source 102 will be cleaned with a purge gas after generating phosphorous (P) ions before boron, BF2, or arsenic ions are to be generated by ion source 102.

Mass analyzer 104 comprises a decomposition magnet (not shown) adapted to apply a dipole magnetic field perpendicular to the direction of ion beam 100 in order to selectively extract a desired ion species from the plurality of ions and atoms species generated by ion source 102. In this manner, various ions having different masses and charges are given different angles of deflection in accordance with their respective mass and/or charge. Mass analyzer 104 further comprises a mask 103 comprising a slit 103a adapted to allow impurity ions having a similar deflection angle to pass.

Each ion that passes through mass analyzer 104 is characterized by the following relationship between electrical energy, kinetic energy, and centripetal force:

$$r = \frac{const}{B} \sqrt{\frac{mV}{Q}},$$

wherein "r" is the radius of curvature for the deflection angle, "const" is a constant, "B" is the intensity of the magnetic field, "m" is the mass of the ion, "V" is the energy of the ion, and "Q" is the charge of the ion.

Accordingly, mass analyzer 104 can separate, extract, and selectively pass through slit 103a only conductive impurity ions having a predetermined radius of curvature (r) defined by its mass and charge. As with ion source 102, a cleaning process using a purge gas is also performed on mass analyzer 104 between uses, particularly where adjacent uses are directed to extracting ions of different conductivity types.

Since ion beam 100, as provided by mass analyzer 104, may be scattered while passing through slit 103a and thus radially scattered, ion beam 100 is focused by first magnetic focusing electrode 106. In effect, first magnetic focusing electrode 106 is adapted to form a focusing electric field having a predetermined direction.

For example, first magnetic focusing electrode 106 may comprise a plurality of quadrupole magnetic lens plates 105 adapted to focus ion beam 100, which is assumed in the working example to have a positive charge as provided by mass analyzer 104. Quadrupole magnetic lens plates 105 may consist of permanent magnets or electromagnets having North (N) and South (S) poles alternately positioned around the transmission path of ion beam 100, and are formed to satisfy Fleming's right-hand rule, such that ion beam 100 is focused and advanced towards the center of the induced magnetic field rotating in a counterclockwise direction.

Ion beam 100 as focused by first magnetic focusing electrode 106 is provided to scanning system 108. Scanning system 108 conditions ion beam 100 to have a uniform beam width and/or a predetermined ion concentration.

Scanning system 108 comprises, for example, a plurality of electrostatic deflector plates 107a through which ion beam 100 passes, and which is adapted to scatter ion beam 100 in multiple directions. Scanning system 108 further comprises, for example, a magnetic deflector plate 107b adapted to focus ion beam 100, which was radially scattered by electrostatic deflector plates 107a, such that ion beam 100 advances in a single direction (i.e., in the Z-direction). A voltage having a defined frequency may be applied to both ends of the plurality of electrostatic deflector plates 107a to scatter ion beam 100 passing between the plurality of electrostatic deflector plates 107a. While a first electrostatic deflector plate 107a is disposed parallel to the direction of ion beam 100 as it enters scanning system 108, another electrostatic deflector plate 107a is disposed at an angle greater than 0° from a line parallel with first electrostatic deflector plate 107a. In the illustrated embodiment, since ion beam 100 comprises conductive impurities having a positive charge, a repulsive force can periodically be applied to ion beam 100 (by means of the applied voltage) as ion beam 100 passes between the plurality of electrostatic deflector plates 107a; and thus, ion beam 100 may be scattered in a radial pattern having a predetermined angle.

Magnetic deflector plate 107b is adapted to focus ion beam 100 which is directed towards it in the defined radial pattern by the plurality of electrostatic deflector plates 107a. In this manner, magnetic deflector plate 107b may precisely define a beam width for ion beam 100. For example, magnetic deflector plate 107b may apply a magnetic field in a direction perpendicular to ion beam 100 to change its deflection angle according to Lorentz or Faraday's law. In this manner, the direction of advance for all of the components forming ion beam 100, as supplied from the plurality of electrostatic deflector plates 107a, may be made uniform in one direction (e.g., in the Z-direction).

In addition, magnetic deflector plate 107b may be used to modify the intensity of the magnetic field or a magnetic field-applied area in accordance with the deflection angle of ion beam 100, and thereby transform the radially spread ion beam 100 into a focused ion beam 100 having a constant beam width. For example, magnetic deflector plate 107b may be formed so as to expose ion beam 100 to a magnetic flux having an increasingly wide area in proportion to the deflection angle of ion beam 100 as scattered by the plurality of electrostatic deflector plates 107a. In other words, magnetic deflector plate 107b forms a magnetic field perpendicular to ion beam 100 at one or both sides through which ion beam 100 passes, thereby deflecting the advancing components of ion beam 100.

In the illustrated embodiment, ion beam 100 output by scanning system 108 has a beam width defined in the X-direction. In addition to defining beam width, when ion beam 100 passes between magnetic deflector plates 107b, ion beam 100 may be altered to have defined thickness in the Y-direction. (See, FIG. 3). This distance may be defined in one embodiment to be substantially equal to the distance between magnetic deflector plates 107b. Accordingly, scanning system 108 may generate ion beam 100 having a defined uniform thickness in the Y-direction and a defined uniform beam width in the X-direction. In this manner, the ion concentration of ion beam 100 may be readily controlled as a function of irradiated unit area of the target wafer.

After being output from scanning system 108, ion beam 100 is accelerated by accelerator 109. Accelerator 109 accelerates ion beam 100 by applying different voltages to each of a plurality of accelerating electrodes (not shown) each having a slot through which ion beam 100 passes. For example, for the plurality of accelerating electrodes, a relatively lower voltage is applied to a first accelerating electrode than to a second accelerating electrode, wherein the first accelerating electrode is farther from scanning system 108 and nearer to wafer W than the second accelerating electrode. Also, a relatively high voltage is applied to the accelerating electrode of the plurality of accelerating electrodes that is nearest to scanning system 108, and the accelerating electrode nearest to wafer W is grounded. Thus, the relatively nearer an accelerating electrode is to wafer W, the relatively lower is the voltage applied to that accelerating electrode so that ion beam 100 passing through the slots can be gradually accelerated. Accordingly, the energy of ion beam 100 can be determined in accordance with a distance between the accelerating electrodes and the voltages applied to the accelerating electrodes. In addition, ion beam 100 passing through the slots of the accelerating electrodes can be controlled to have a uniform or constant concentration in a beam width corresponding to the slots. Although not shown, the beam width and thickness of ion beam 100, accelerated by accelerator 109, may be altered by means of a second magnetic focusing electrode, wherein the beam width and thickness of ion beam 100 were previously defined in scanning system 108. In addition, after an ion beam 100 comprising conductive impurities of a first type pass through scanning system 108, accelerator 109, and the second magnetic focusing electrode, a cleaning process using a purge gas should be performed before an ion beam 100 comprising conductive impurities of a second type different than the first type pass through scanning system 108, accelerator 109, and the second magnetic focusing electrode.

Figure 3:
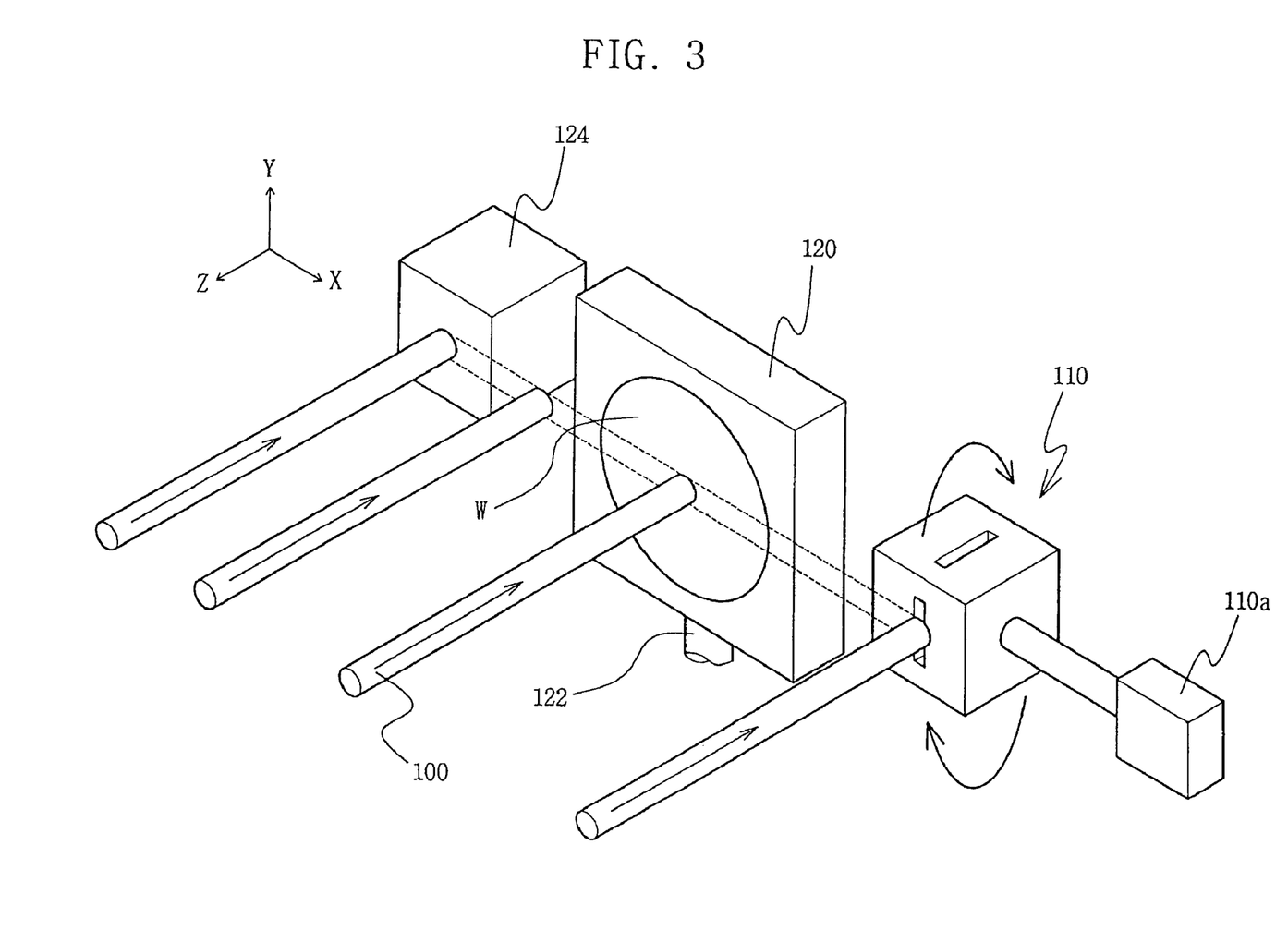
FIG. 3 is a perspective view showing a target of FIG. 2 and the Faraday system of FIG. 2.

FIG. 3 is a perspective view showing target 120 and Faraday system 110 of FIG. 2. Ion beam 100 is provided to a surface of wafer W, which is held by target 120. The energy of ion beam 100 is controlled in accordance with the accelerating electrodes. Further, in one embodiment, the beam width of ion beam 100 may be greater than the width of wafer W. Shaft 122 moves target 120 vertically (e.g., in the Y-direction) in a controlled manner so that the entire surface of wafer W may be exposed to ion beam 100. The "working surface" of target 120 is the surface of target 120 on which wafer W is disposed. In one embodiment, the working surface of target 120 may, for example, have a shape similar to the shape of wafer W. In another embodiment, the working surface of target 120 may be square-shaped, wherein each side of the square is longer than the diameter of wafer W.

When ion beam 100 is provided to target 120 and wafer W, an edge portion of ion beam 100 is provided to Faraday system 110 so that the concentration of ion beam 100 may be detected. Accordingly, Faraday system 110 is an ion beam detecting apparatus used to detect the concentration of ion beam 100 provided to wafer W so that ion source 102, mass analyzer 104, first magnetic focusing electrode 106, scanning system 108, and accelerator 109 may be controlled with optimized conditions. In addition, Faraday system 110 can detect the concentration of ion beam 100 until ion beam 100 has been provided to the entire front surface of wafer W. In the illustrated embodiment, Faraday system 110 is not moved vertically even though shaft 122 does move target 120 and wafer W vertically. FIG. 3 also shows an ion beam stopper 124.

Figure 4:
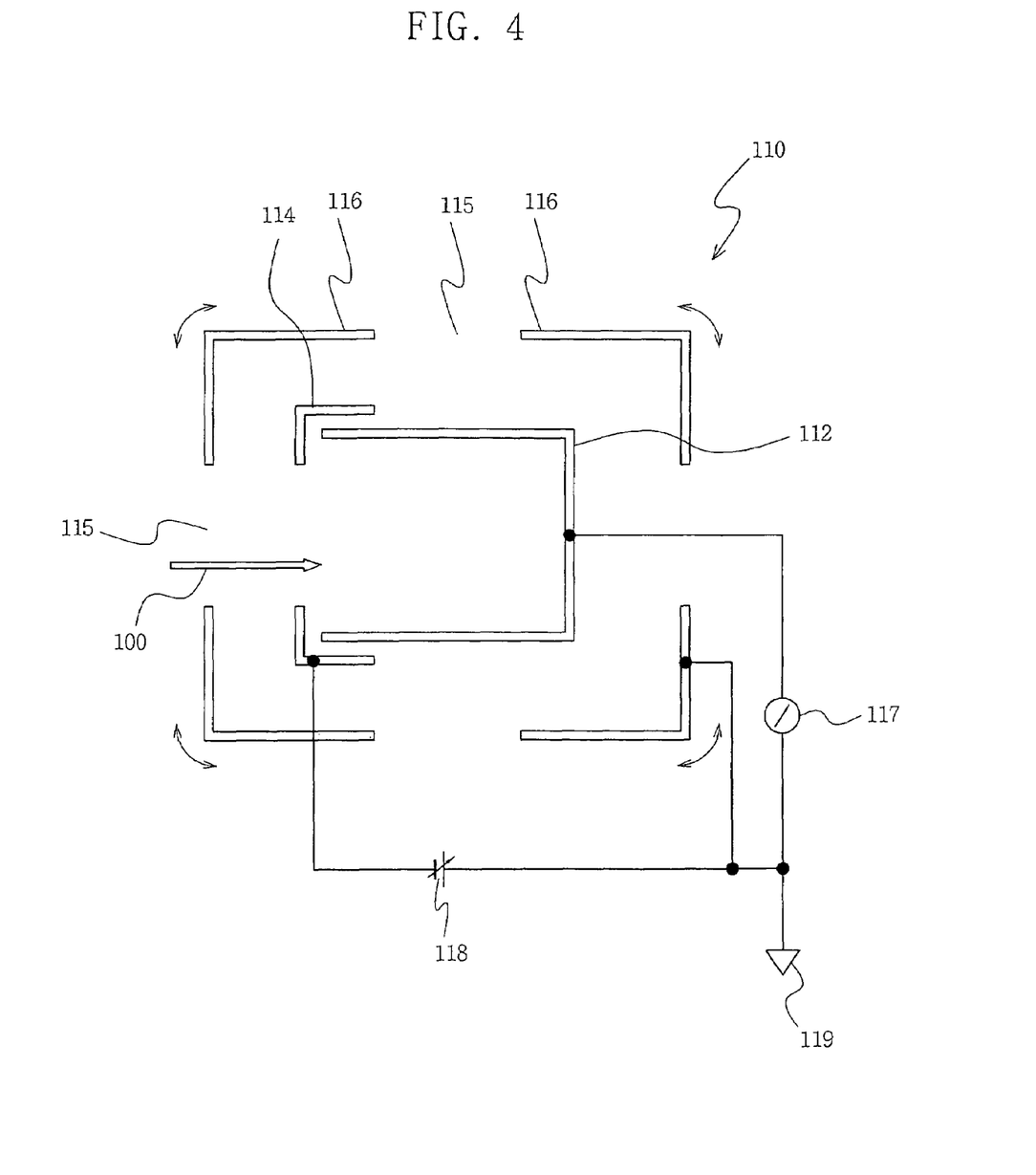
FIG. 4 is a detailed sectional view of the Faraday system of FIG. 2.

FIG. 4 is a detailed sectional view of Faraday system 110 of FIG. 2. Faraday system 110 comprises a Faraday cup 112 adapted to collect ion beam 100 to generate a current; a suppression electrode 114 adapted to form an electric field (i.e., an electric field having a magnitude) adjacent to an inlet of Faraday cup 112 to prevent secondary electrons collected in Faraday cup 112 from discharging from Faraday cup 112 in response to ion beam 100; and a housing 116 surrounding suppression electrode 114 and Faraday cup 112 and having a plurality of apertures 115 that are each adapted to selectively receive a corresponding type of ion beam 100 of the plurality of types of ion beams 100 collected in Faraday cup 112. As used herein, the "type" of an ion beam is defined in accordance with the type of impurity ions that the ion beam comprises. For example, if a first ion beam is a different type of ion beam than a second ion beam, then the first and second ion beams comprise different types of impurity ions.

Faraday cup 112 is bowl-shaped, having an opening facing in the direction opposite the direction in which ion beam 100 advances (as illustrated in FIG. 4), and is adapted to collect ion beam 100. Faraday cup 112 may be formed from, for example, a metal having excellent conductivity and capable of absorbing charges of ion beam 100 that collide with Faraday cup 112, such as aluminum. The charges of ion beam 100 that collide with Faraday cup 112 are counted and shown on an ammeter 117 in terms of the number of charges per unit of time. In the illustrated embodiment, ammeter 117 is connected in series between Faraday cup 112 and ground 119. Accordingly, Faraday cup 112 collects ion beam 100 having a positive charge to allow ammeter 117 to detect a current.

In addition, ion beam 100 collected in Faraday cup 112 can generate secondary electrons when ion beam 100 collides with a surface of Faraday cup 112. The secondary electrons in Faraday cup 112 can be spattered onto wafer W disposed on target 120, which is adjacent to Faraday system 110, and thereby affect the energy of ion beam 100. However, it is possible to keep the secondary electrons generated in Faraday cup 112 within Faraday cup 112 using suppression electrode 114. For example, suppression electrode 114 may be ring-shaped, may surround the inlet of Faraday cup 112, and an external voltage supply element 118 may apply a negative direct current voltage to suppression electrode 114 to prevent the discharge of the secondary electrons.

In addition, suppression electrode 114 and Faraday cup 112 are surrounded by housing 116, which protects Faraday cup 112 and suppression electrode 114 from ion beam 100 so that ion beam 100 is not applied to outer surfaces of Faraday cup 112 and suppression electrode 114. Housing 116 also comprises apertures 115 adapted to selectively receive ions provided to Faraday system 110, and ion beam 100 is supplied to suppression electrode 114 and Faraday cup 112 through apertures 115. In addition, housing 116 is grounded through ground 119 so that it does not become electrically charged as a result of contact with ion beam 100, which has a positive charge.

Housing 116 may be formed from, for example, graphite capable of absorbing ion beam 100 and minimizing a reaction caused by ion beam 100 contacting housing 116. After ion beam 100 has contacted housing 116, conductive impurities from ion beam 100 are left on the surface of housing 116 where ion beam 100 contacted edges of an aperture 115. Conductive impurities left on the surface of housing 116 can have a detrimental effect on a subsequent ion implantation process. For example, when an ion beam 100 comprising conductive impurities of a first type collides with conductive impurities of a second type different than the first type which have collected on housing 116, the conductive impurities of the second type may be spattered onto wafer W disposed on target 120, which is adjacent to Faraday system 110, thereby contaminating the surface of wafer W. For example, during a process in which phosphorous (P) (a group V element) has collected on housing 116 adjacent to an aperture 115 and an ion implantation process using boron (a group III element) is subsequently performed, when ion beam 100 comprising boron collides with the phosphorous that has collected on housing 116, the phosphorous may be spattered onto the surface of wafer W. Thus, the surface of wafer W may be contaminated by the phosphorous.

After the concentration of ion beam 100 comprising conductive impurities of the first type is detected, a cleaning process using a purge gas may be performed before an ion beam 100 comprising conductive impurities of the second type is provided to Faraday system 110. However, because the cleaning process using the purge gas does not completely clean the surface of housing 116, onto which ion beam 100 having a high energy level is irradiated, certain conductive impurities can remain on the surface of housing 116 even after the cleaning process.

However, if conductive impurities of the first and second type are the same or similar, the ion implantation process defect described above will not result from having conductive impurities of second type being spattered on wafer W during a process implanting conductive impurities of first type. Accordingly, in accordance with exemplary embodiments of the invention, Faraday system 110 is adapted to use a single face of housing 116 to shield Faraday cup 112 from each ion beam 100 of a single class of ion beams, while using different faces of housing 116 to shield Faraday cup 112 from ion beams 100 of different classes to thereby prevent the ion implantation error described above. As used herein, a "class" of ion beams is a grouping of ion beams 100 wherein all ion beams 100 in a single class of ion beams comprise the same or similar types of conductive impurities.

Referring to FIGS. 3 and 4, as used herein, the "applied direction of the ion beam" is the direction in which the ion beam moves from scanning system 108 to target 120 and Faraday system 110, which is also perpendicular to target 120 (i.e., in the Z-direction (third direction)). Also, as used herein, an "active face" of a housing adapted to rotate is a face that is perpendicular to the applied direction of the ion beam at some orientation of the housing (i.e., at some orientation to which the housing may rotate), and a "passive face" is any face of the housing that is not an active face. In the illustrated embodiment, housing 116 has a polyhedral shape, is adapted to rotate, and surrounds the outer surfaces of Faraday cup 112 and suppression electrode 114. In addition, each of the plurality of apertures 115 is disposed in an active face of housing 116 (i.e., the plurality of apertures 115 are sequentially positioned around housing 116 in the direction in which housing 116 rotates, as illustrated in FIG. 3). Additionally, whenever ion beam 100 is applied to Faraday cup 112 and suppression electrode 114 through an aperture 115, housing 116 is oriented such that an active face of housing 116 in which an aperture 115 is formed is perpendicular to and facing ion beam 100.

In the illustrated embodiment of FIG. 3, housing 116 is cubic, has four active faces, and is adapted to rotate 360 degrees around a rotational axis that passes through housing 116. In the illustrated embodiment shown in FIG. 3, a passive face that is perpendicular to each of the four active faces is connected to a rotating apparatus 110a that is adapted to rotate housing 116. Housing 116 rotates such that a different active face of the four active faces is perpendicular to and facing ion beam 100 during each of a plurality of ion implantation processes using boron, BF2, phosphorous, and arsenic, respectively. Thus, for each type of ion beam 110, housing 116 can shield Faraday cup 112 from the portion of ion beam 110 that is irradiated onto the periphery of the aperture 115 that is receiving ion beam 100 into housing 116 while preventing the ion implantation error described above. In addition, rotating apparatus 110a may be adjacent to target 120, or housing 116 may be disposed between rotating apparatus 110a and target 120. Also, an aperture 115 of the plurality of apertures 115 is disposed in the center of each of the four active faces, and each of apertures 115 is either the same size or they are each similar in size.

When the active faces of housing 116 comprising apertures 115 rotate around a rotational axis disposed in the X-direction that passes through housing 116, Faraday system 110 is disposed between target 120 and rotating apparatus 110a. Although not shown, when the active faces of housing 116 comprising apertures 115 rotate around a rotational axis disposed in the Y-direction that passes through housing 116, rotating apparatus 110a is formed adjacent to target 120. Faraday cup 112 and suppression electrode 114 are connected to a plurality of wires leading into a rotational center of cubic housing 116 and are thereby supplied with a current or voltage. In other words, Faraday cup 112 and suppression electrode 114 in housing 116 are connected to a plurality of wires leading from rotating apparatus 110a into housing 116. The wires may be connected to a center bar (not shown) disposed in the same direction as the rotational axis around which housing 116 rotates, for example. The center bar holds Faraday cup 112 and suppression electrode 114 in place, and rotating apparatus 110a is connected to a gear formed on a tip of a tube (not shown), wherein the tube surrounds the center bar and is adapted to rotate housing 116.

In addition, apertures 115 formed in the four active faces of housing 116 selectively receive ion beam 100 into Faraday cup 112 or suppression electrode 114. Apertures 115 may be, for example, elongated-rectangle apertures, each having the same or a similar size. As used herein, an "elongated-rectangle aperture" is a rectangular aperture formed in an active face of a housing such that, when the active face is oriented such that it is substantially perpendicular to the applied direction of the ion beam, the aperture is longer in the Y-direction than in the X-direction. Additionally, the shape of an aperture does not change as the housing rotates, but rather the orientation of the aperture relative to the applied direction of the ion beam changes. Also, straight lines passing perpendicularly through the respective centers of apertures 115 formed in the four active faces of housing 116 would meet at a point in housing 116.

In addition, since each of the four active faces comprising apertures 115 are parallel or perpendicular to one another, and because the active faces are formed as faces of a cube, Faraday system 100 can operate such that, when a portion of an ion beam 100 comprising conductive impurities of a first type, for example, passes through a first aperture 115, ion beam 100 is perpendicularly irradiated onto only a first active face (i.e., the active face comprising first aperture 115 ) of housing 116. If any conductive impurities remain on the first active face, conductive impurities that are the same as or similar to conductive impurities of the first type remain on the first active face. Additionally, when Faraday system 110 operates as described above, the first active face of housing 116 shields ion beam 100 from the active face that is parallel to the first active face, and ion beam 110 is parallel to the other faces of housing 116. So, because it is possible to operate Faraday system 110 such that ion beam 100 is irradiated onto only one active face at a time, it is possible to prevent conductive impurities that are a different type than the conductive impurities of ion beam 100 and the conductive impurities that remain on the surface of housing 116 from being spattered onto wafer W.

Accordingly, Faraday system 110 comprises housing 116, which is adapted to rotate so that different active faces of housing 116 may shield Faraday cup 112 from ion beams 100 comprising conductive impurities of different types. Thus, during an ion implantation process using an ion beam 100 comprising impurity ions of a first type, it is possible to prevent impurity ions of a second type different from the first type from being spattered by ion beam 100 onto wafer W thereby contaminating the surface of wafer W. By preventing the previously mentioned problem, it is possible to increase production yield for the semiconductor devices being formed on the wafer.

Exemplary embodiments of the invention have been described above; however, the scope of the invention is not limited to the disclosed exemplary embodiments. Rather, the scope of the invention includes various modifications and alternative arrangements within the capabilities of a person skilled in the art. For example, housing 116 may be a polyhedron such as a hexahedron, heptahedron, octahedron, decahedron, and the like. The scope of the claims, therefore, should be accorded the broadest interpretation so as to encompass all such modifications and similar arrangements.

What is claimed is:

1. A Faraday system comprising:
   a Faraday cup adapted to collect an ion beam and to generate a corresponding current;
   a suppression electrode adapted to form an electric field adjacent to an inlet of the Faraday cup to prevent secondary electrons from discharging from the Faraday cup in response to the ion beam; and,
   a housing surrounding the Faraday cup and the suppression electrode and comprising a plurality of apertures, wherein each aperture is adapted to selectively receive an ion beam comprising a corresponding type of conductive impurities, and the housing is adapted to rotate, such that the plurality of apertures are sequentially positioned relative to an applied direction of the ion beam.

2. The Faraday system of claim 1, wherein the housing is adapted to rotate around a rotational axis passing through the housing; and, the rotational axis is disposed substantially perpendicular to the applied direction of the ion beam, wherein the applied direction of the ion beam is a third direction.

3. The Faraday system of claim 2, wherein the housing has a polyhedral shape and each of the plurality of apertures is formed in an active face of the housing.

4. The Faraday system of claim 3, wherein the housing comprises four active faces;

an aperture of the plurality of apertures is disposed in the center of each of the four active faces of the housing; and, the housing is adapted to rotate in one direction.

5. The Faraday system of claim 4, wherein the four active faces are respectively adapted to selectively receive ion beams comprising boron, BF2, phosphorous, and arsenic.

6. The Faraday system of claim 4, wherein each aperture of the plurality of apertures is an elongated-rectangle aperture and each aperture of the plurality of apertures is substantially the same size.

7. The Faraday system of claim 4, further comprising a rotating apparatus disposed perpendicular to the applied direction of the ion beam and adapted to rotate the housing, wherein the housing comprises two passive faces, the passive faces have no apertures, and the rotating apparatus is disposed perpendicular to the two passive faces.

8. The Faraday system of claim 7, wherein the housing is disposed between the rotating apparatus and a target and the rotational axis is disposed in a first direction.

9. The Faraday system of claim 7, wherein a target is adjacent to the rotating apparatus and the housing and the rotational axis is disposed in a second direction.

10. The Faraday system of claim 7, wherein the Faraday cup and the suppression electrode are connected to a plurality of wires leading from the rotating apparatus into the housing.

11. The Faraday system of claim 10, wherein the wires are connected to a center bar;

the center bar is disposed perpendicular to the applied direction of the ion beam and is adapted to hold the Faraday cup and the suppression electrode in place; and, the rotating apparatus is connected to a gear formed on a tip of a tube surrounding the center bar.

12. An ion implantation apparatus comprising:

an ion source adapted to produce conductive impurity ions;

a mass analyzer adapted to separate/extract conductive impurity ions having a defined mass and/or charge;

a magnetic focusing electrode adapted to focus the conductive impurity ions received from the mass analyzer;

a scanning system adapted to control beam width and ion concentration of an ion beam, and to provide the ion beam to a wafer surface;

an accelerator adapted to accelerate the ion beam provided by the scanning system;

a target adapted to hold and move a wafer in order to expose the wafer to the ion beam provided by the accelerator; and, a Faraday system comprising a housing disposed adjacent to the target, surrounding a Faraday cup adapted to determine the concentration of the ion beam, comprising a plurality of apertures, and adapted to rotate in accordance with the type of conductive impurity ions of the ion beam provided by the scanning system, wherein each aperture is adapted to selectively receive an ion beam comprising a corresponding type of conductive impurity ions.

13. The Faraday system of claim 12, wherein the housing is adapted to rotate around a rotational axis passing through the housing; and, the rotational axis is disposed substantially perpendicular to the applied direction of the ion beam, wherein the applied direction of the ion beam is a third direction.

14. The Faraday system of claim 13, wherein the housing is a hexahedron and each of the plurality of apertures is formed in an active face of the housing.

15. The Faraday system of claim 14, wherein the housing comprises four active faces;

an aperture of the plurality of apertures is disposed in the center of each of the four active faces of the housing; and, the housing is adapted to rotate in one direction.

16. The Faraday system of claim 15, wherein the four active faces are respectively adapted to selectively receive ion beams comprising boron, BF2, phosphorous, and arsenic.

17. The Faraday system of claim 15, wherein each aperture of the plurality of apertures is an elongated-rectangle aperture and each aperture of the plurality of apertures is substantially the same size.

18. The Faraday system of claim 15, further comprising a rotating apparatus disposed perpendicular to the applied direction of the ion beam and adapted to rotate the housing, wherein the housing comprises two passive faces, the passive faces have no apertures, and the rotating apparatus is disposed perpendicular to the two passive faces.

19. The Faraday system of claim 18, wherein the housing is disposed between the rotating apparatus and a target and the rotational axis is disposed in a first direction.

20. The Faraday system of claim 18, wherein a target is adjacent to the rotating apparatus and the housing and the rotational axis is disposed in a second direction.

* * * * *